US009151776B2

(12) United States Patent
Jeong et al.

(10) Patent No.: US 9,151,776 B2
(45) Date of Patent: Oct. 6, 2015

(54) COMBINED SENSOR

(75) Inventors: Heewon Jeong, Tokyo (JP); Masahide Hayashi, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 250 days.

(21) Appl. No.: 13/983,828

(22) PCT Filed: Jan. 10, 2012

(86) PCT No.: PCT/JP2012/050214
§ 371 (c)(1),
(2), (4) Date: Aug. 6, 2013

(87) PCT Pub. No.: WO2012/111357
PCT Pub. Date: Aug. 23, 2012

(65) Prior Publication Data
US 2013/0312517 A1 Nov. 28, 2013

(30) Foreign Application Priority Data

Feb. 16, 2011 (JP) .................. 2011-030790

(51) Int. Cl.
*G01C 19/5719* (2012.01)
*G01P 15/125* (2006.01)
(Continued)

(52) U.S. Cl.
CPC .......... *G01P 15/125* (2013.01); *G01C 19/5719* (2013.01); *G01C 19/5726* (2013.01);
(Continued)

(58) Field of Classification Search
CPC ... G01C 19/5719; G01P 15/14; G01P 15/132; G01P 15/125; A63B 2220/40; A63B 24/0003; G01H 3/00; G01H 1/00

USPC .............. 73/504.04, 504.03, 504.12, 514.15, 73/514.21, 514.29, 514.36, 570, 504.02, 73/491, 510, 514.01, 652, 488
See application file for complete search history.

(56) References Cited

U.S. PATENT DOCUMENTS

2002/0051258 A1* 5/2002 Tamura ......................... 358/514
2005/0076714 A1* 4/2005 Sakai et al. ................ 73/514.32
(Continued)

FOREIGN PATENT DOCUMENTS

JP        2001-91263 A     4/2001
JP        2002-5950 A      1/2002
(Continued)

OTHER PUBLICATIONS

International Search Report dated Feb. 14, 2012 with English translation (Seven (7) pages).

*Primary Examiner* — Lisa Caputo
*Assistant Examiner* — Nigel Plumb
(74) *Attorney, Agent, or Firm* — Crowell & Moring LLP

(57) ABSTRACT

An object of the invention is to provide a combined sensor capable of suppressing the influence of electrostatic force generated by a potential difference and preventing a reduction in the S/N ratio or a variation in the sensitivity of a sensor.
A combined sensor according to the invention includes first and second movable portions and first and second dummy portions provided around the first and second movable portions, which are formed in a layer of a laminated substrate. The first dummy portion and the second dummy portion are electrically separated from each other. A first potential is applied to the first movable portion and the first dummy portion and a second potential is applied to the second movable portion and the second dummy portion (see FIG. 2).

13 Claims, 4 Drawing Sheets

(51) Int. Cl.
G01P 15/08 (2006.01)
G01C 19/5733 (2012.01)
G01C 19/5726 (2012.01)
*H01L 29/84* (2006.01)
*G01C 19/5769* (2012.01)

(52) U.S. Cl.
CPC ........ G01C19/5733 (2013.01); G01P 15/0802 (2013.01); *G01C 19/5769* (2013.01); *G01P 2015/0814* (2013.01); *H01L 29/84* (2013.01)

(56) References Cited

U.S. PATENT DOCUMENTS

2009/0126491 A1* 5/2009 Yamanaka et al. ......... 73/514.32
2009/0183568 A1* 7/2009 Yamanaka et al. ......... 73/504.04
2010/0127715 A1* 5/2010 Jeong et al. ................... 324/661
2011/0048129 A1* 3/2011 Yamanaka et al. ......... 73/504.12

FOREIGN PATENT DOCUMENTS

| | | |
|---|---|---|
| JP | 3435665 B2 | 8/2003 |
| JP | 2005-114564 A | 4/2005 |
| JP | 2009-145321 A | 7/2009 |
| JP | 2009-168777 A | 7/2009 |
| JP | 2010-145212 A | 7/2010 |
| WO | WO 2004/065968 A1 | 8/2004 |
| WO | WO 2010/119573 A1 | 10/2010 |

* cited by examiner

COMBINED SENSOR

TECHNICAL FIELD

The present invention relates to a combined sensor including a plurality of sensors provided on a substrate.

BACKGROUND ART

An inertia measurement sensor or a control sensor which is used in a vehicle traveling control device or a robot posture control device is manufactured by, for example, a micro-electro-mechanical systems (MEMS) technique. A sensor which measures an inertia using a variation in capacitance has been known as an example of the inertia measurement sensor.

Among inertial sensors, there is a so-called combined sensor which can detect acceleration and an angular velocity, which are kinds of the inertia, at the same time. For example, the following technique is used to achieve the combined sensor.

With the progress of a semiconductor process technique and a micro-machining technique (so-called MEMS technique), a MEMS combined sensor element which includes a detection circuit and detects an inertia using the detection circuit has come into widespread use. For example, an antiskid brake system of the vehicle detects the rotation of the vehicle and acceleration applied to the vehicle in all directions using an angular velocity sensor and a biaxial acceleration sensor and adjusts an engine output and the braking force of four wheels to control the traveling state of a moving body. In general, as the sensors used in the antiskid brake system of the vehicle, one angular velocity sensor and acceleration sensors with a plurality of detection axes are mounted on a printed circuit board. In some cases, in order to meet a demand for low manufacturing costs, a plurality of sensor elements are incorporated into one sensor element to reduce manufacturing costs or mounting costs.

An example of the technique related to the inertial sensor is disclosed in the following PTL 1.

When a silicon wafer is used to form the MEMS combined sensor, it is processed by a silicon deep etching technique. The deep etching technique is a processing technique which repeatedly performs chemical etching using $SF_6$ gas as a main component and chemical deposition using $CF_4$ gas as a main component. A needle-shaped silicon residue which is called black silicon is generated in a portion with a large etching area by the influence of the uniformity of deposition or the local charge-up of ions (a variation in potential due to the flow of charge) and becomes conductive dust. The dust is not preferable in terms of the characteristics of the sensor.

In addition, when a region in which the aspect ratio of a processing portion which is defined by the ratio of the thickness and the gap of the silicon wafer is greatly different is generated in the plane of the wafer due to a difference in the entrance state of gas or ions, a variation in the etching rate occurs. This phenomenon is called a micro-loading effect, in which the etching rate is reduced as an opening portion of an etched region is reduced. The time required to complete deep etching for a fine pattern portion is increased by the micro-loading effect.

A variation in the time required to complete etching causes a processing pattern portion other than the fine pattern requiring the longest time to be exposed to a chemical, which is an etchant, even though the etching of the processing pattern portion has been completed, and the processing pattern portion is over-etched. As a result, there is a difference between the dimensions of the top of the inertial body and the dimensions of the bottom of the inertial body and the inertial body cannot be processed as designed, which is not preferable. In order to prevent a variation in the opening of the etched region to suppress a variation in the processed dimensions, a dummy pattern which does not directly contribute to the sensor performance is provided around an inertial mass body, a movable electrode and a fixed electrode forming a detection electrode, and a support beam structure pattern in the same plane.

Conductive portions, such as the dummy pattern which is provided in order to reduce conductive dust or control the variation in the processed dimensions, a supporting layer for fixing and supporting the inertial mass body, the detection electrode, the support beam, and the dummy pattern, and a lid for surrounding or covering these components, are referred to as 'peripheral conductors'. The peripheral conductors include single-crystal silicon or an insulating film and a conductive film which are formed on the single-crystal silicon. In addition, when the inertial mass body, the detection electrode, the support beam, and the peripheral conductors are made of single-crystal silicon, a natural oxide film with a thickness of about several nanometers is formed on the surface of the processed peripheral conductors.

The peripheral conductors including the dummy pattern provided around the inertial mass body or the support beam need to be fixed to a predetermined potential in order to prevent charge-up due to electromagnetic waves or static electricity. However, when the peripheral conductors are fixed to a potential different from the potential of movable portions, such as adjacent inertial mass bodies, electrostatic attractive force is generated between the peripheral conductors and the movable portions. As a result, for example, defects, such as an offset, a variation in sensitivity, sticking, and a short circuit, occur in the sensor. Therefore, it is preferable that the peripheral conductors and the movable portions adjacent to the peripheral conductors have the same potential.

The following PTL 2 discloses an example of the technique related to the inertial sensor.

CITATION LIST

Patent Literature

PTL 1: Japanese Patent No. 3435665
PTL 2: JP-A-2009-145321

SUMMARY OF INVENTION

Technical Problem

However, the inventors examined the technique related to the inertial sensor and found the following.

For example, when the angular velocity sensor and the acceleration sensor are provided on one chip to be incorporated compositively to form a combined sensor, the inertial mass bodies forming the angular velocity sensor and the acceleration sensor have different desired reference potentials.

In general, the acceleration sensor outputs a voltage of $Vref/2+\Delta V$ (where $Vref/2$ which is an intermediate value of a power supply voltage Vref is a reference potential) when acceleration is applied in the positive direction and outputs a voltage of $Vref/2-\Delta V$ when acceleration is applied in the negative direction.

On the other hand, for the angular velocity sensor, in some cases, the natural angular frequency is controlled to fall within a predetermined range, for example, the detection-side natural angular frequency is controlled to be equal to the driving angular frequency in order to obtain high sensitivity. As a method of controlling the natural angular frequency, there is a method which applies a DC voltage between a movable electrode provided in the inertial mass body and a fixed electrode which is provided so as to face the movable electrode and is fixed to the supporting layer to generate electrostatic force, thereby reducing the apparent spring constant. This is a tuning method using a so-called electrostatic spring effect.

The frequency range which can be adjusted by this effect is limited by the potential difference between the movable electrode and the fixed electrode. Therefore, it is necessary to minimize the potential applied to the inertial mass body of the angular velocity sensor to ensure a tuning voltage, in order to absorb a variation in the natural angular frequency due to a processing error during manufacturing and to improve yield.

It is preferable that the same potential as that applied to adjacent inertial mass bodies be applied to the dummy patterns which are provided around the inertial mass bodies in the acceleration sensor and the angular velocity sensor, in order to prevent an unnecessary tuning effect.

When the acceleration sensor and the angular velocity sensor are separately formed without being compositively incorporated, it is relatively easy to make the potential of the inertial mass body equal to that of the dummy pattern provided around the inertial mass body. However, in the case of a combined sensor in which the inertial mass bodies and the dummy patterns provided around the inertial mass bodies in the angular velocity sensor and the acceleration sensor are compositively formed on one chip, which is the same member, it is difficult to uniformly set the potential of each inertial mass body, the dummy pattern provided around each inertial mass body, and the peripheral conductor, such as the supporting layer or the lid.

The invention has been made in view of the above-mentioned problems and an object of the invention is to improve the S/N ratio and sensitivity of a combined sensor.

Solution to Problem

A combined sensor according to the invention includes first and second movable portions and first and second dummy portions provided around the first and second movable portions, which are formed in a layer of a laminated substrate. The first dummy portion and the second dummy portion are electrically separated from each other. A first potential is applied to the first movable portion and the first dummy portion and a second potential is applied to the second movable portion and the second dummy portion.

Advantageous Effects of Invention

According to the combined sensor of the invention, it is possible to improve the S/N ratio or sensitivity of the combined sensor.

DESCRIPTION OF EMBODIMENTS

Figure 1:
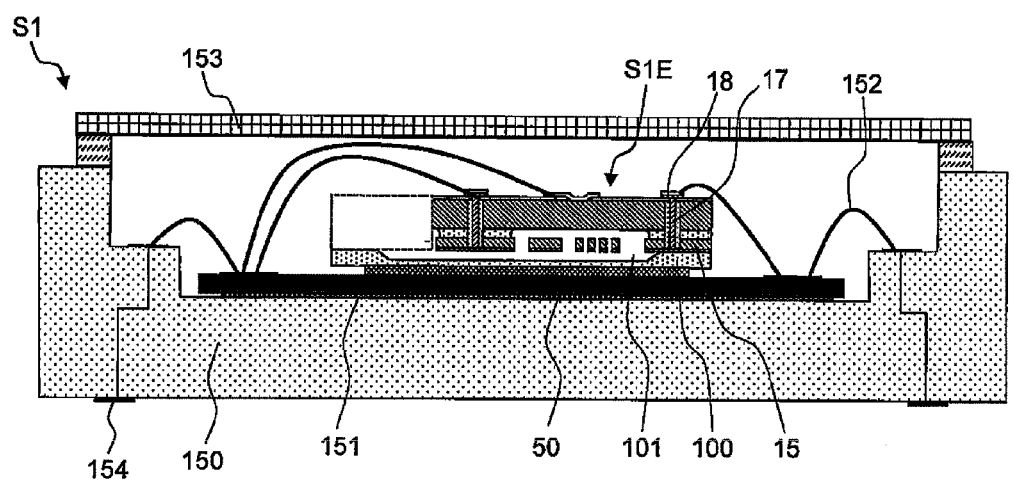
FIG. 1 is a side cross-sectional view illustrating a combined sensor S1 according to a first embodiment.

Hereinafter, embodiments of the invention will be described in detail with reference to the accompanying drawings. In all of the drawings for describing the embodiments, in principle, the same members are denoted by the same reference numerals and the description thereof will not be repeated.

First Embodiment

FIG. 1 is a side cross-sectional view illustrating a combined sensor S1 according to a first embodiment of the invention. The combined sensor S1 includes a ceramic package 150, a signal processing IC 50, and a sensor element S1E. First, the signal processing IC 50 is fixed to the ceramic package 150 through an adhesive 151 and the sensor element S1E is bonded and fixed onto the IC 50. Then, the IC 50, the angular velocity sensor element S1E, and an external input/output terminal 154 of the ceramic package 150 are connected to each other by conductive wires 152 using wire bonding. Finally, the package is sealed with a lid 153 to complete the combined sensor S1.

Although not shown in the drawings, as the package accommodating the components, such as the sensor element S1E and the IC 50, for example, a plastic package may be used instead of the ceramic package 150. That is, any package may be used as long as it can protect the components, such as the conductive wires 152, and receive and transmit signals from and to the outside.

Figure 2:
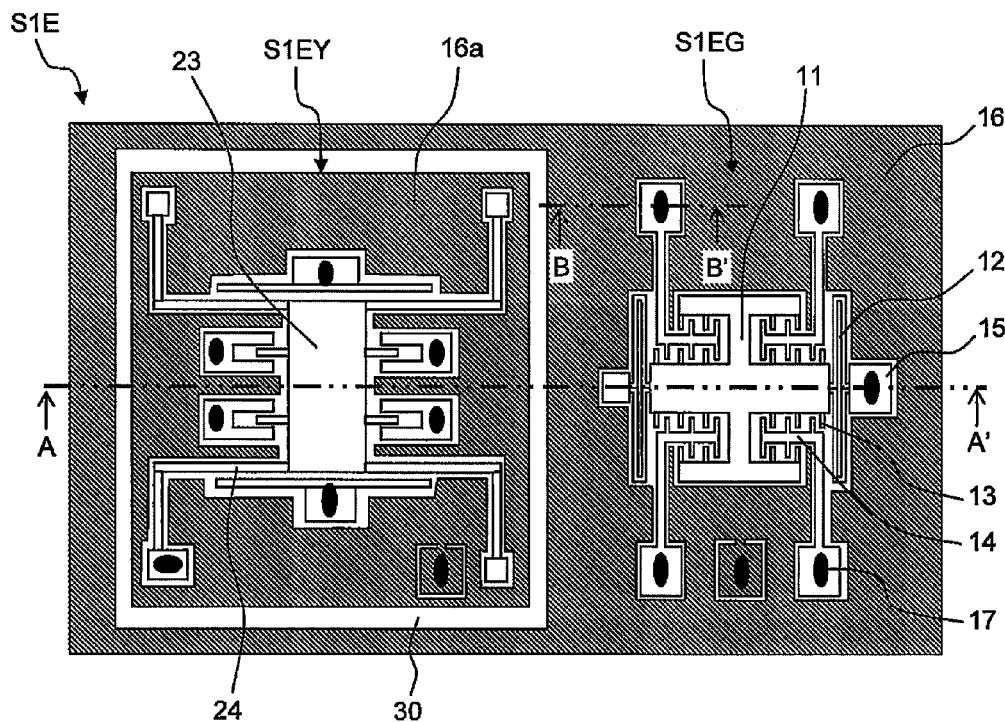
FIG. 2 is a plan view illustrating a sensor element S1E in the first embodiment.
Figure 3:
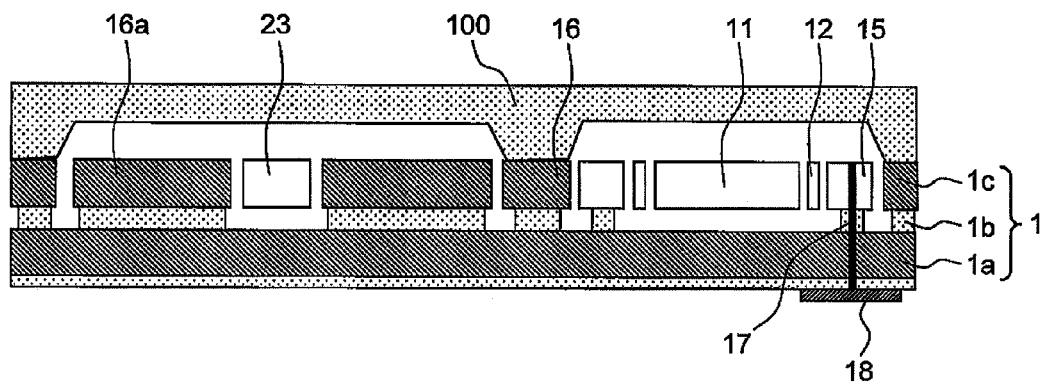
FIG. 3 is a cross-sectional view taken along the line A-A' of FIG. 2.

FIG. 2 is a plan view illustrating the sensor element S1E in the first embodiment. For convenience of explanation, a glass cap 100 described with reference to FIG. 3 is not shown. The sensor element S1E includes an acceleration detecting unit S1EG and an angular velocity detecting unit S1EY.

The acceleration detecting unit S1EG includes an inertial mass body 11, a support beam structure 12, a movable electrode 13, a fixed electrode 14, a suspension portion 15, a dummy pattern 16, and a through electrode 17.

The inertial mass body 11 is a movable portion which is displaced when inertial force is applied to the acceleration detecting unit S1EG. The support beam structure 12 supports the inertial mass body 11. The movable electrode 13 is displaced together with the inertial mass body 11 to form the capacitance between the movable electrode 13 and the fixed electrode 14. The capacitance is changed by the displacement of the inertial mass body 11 and the amount of movement of the inertial mass body 11 can be detected on the basis of the change in the capacitance. The suspension portion 15 fixes and suspends the inertial mass body 11 and the support beam structure 12 to a supporting layer 1a described with reference to FIG. 3. The through electrode 17 passes through the suspension portion 15 and is electrically connected to a pad 18, which will be described below. The dummy pattern 16 is arranged around each of the above-mentioned components in the same plane and does not directly contribute to the functions of the sensor.

The angular velocity detecting unit S1EY includes a dummy pattern 16a, an inertial mass body 23, and a support beam structure 24. A gap 30 is formed between the dummy patterns 16a and 16 to electrically separate the dummy patterns 16a and 16. The inertial mass body 23 is a movable portion which is displaced when an inertial force is applied to the angular velocity detecting unit S1EY. The inertial mass body 23 can be displaced in a driving direction (x) and a detection direction (y). The support beam structure 24 supports the inertial mass body 23.

For example, the operation principle of the acceleration detecting unit S1EG and the angular velocity detecting unit S1EY and the detailed structure of each component of the acceleration detecting unit S1EG and the angular velocity detecting unit S1EY will be described with reference to FIGS. 5 and 6.

In the invention, a 'first movable portion' and a 'second movable portion' correspond to the inertial mass bodies 11 and the movable electrodes thereof. A 'fixed portion' corresponds to the fixed electrode 14 and a fixed electrode of a detection electrode 29, which will be described below. A 'first dummy portion' and a 'second dummy portion' correspond to the dummy patterns 16 and 16a. A 'potential generation circuit' corresponds to a circuit which supplies reference potentials 20a and 20b, which will be described below.

FIG. 3 is a cross-sectional view taken along the line A-A' of FIG. 2. For example, a mechanical component of the sensor element S1E, such as the suspension portion 15, can be formed on a substrate such as an silicon-on-insulator (SOI) substrate 1.

In the SOI substrate 1, an intermediate insulating layer 1b is formed on the supporting layer 1a and an active layer 1c is formed on the intermediate insulating layer 1b. The supporting layer 1a can be made of, for example, silicon (Si). The intermediate insulating layer 1b can be made of, for example, a silicon oxide ($SiO_2$). The active layer 1c can be made of, for example, conductive silicon.

The total thickness of the supporting layer 1a and the intermediate insulating layer 1b is, for example, from several tens of micrometers to several hundreds of micrometers. The thickness of the active layer 1c is, for example, from several micrometers to several tens of micrometers. In the first embodiment, the SOI substrate is used. However, the substrate is not limited to the SOI substrate, but various semiconductor substrates may be used. For example, conductive polysilicon using a surface MEMS technique or plated metal, such as nickel (Ni), may be used as the active layer 1c.

Each component of the combined sensor S1 according to the first embodiment is formed by processing the active layer 1c of the SOI substrate 1. For example, the following method is considered as a method of processing the active layer 1c.

After a resist which reacts to light or an electron beam is applied onto the active layer 1c, a portion of the resist on the active layer 1c is removed by a photolithography technique or an electron beam lithography technique. Then, the exposed active layer 1c is removed by, for example, dry etching, such as reactive ion etching (RIE), or wet etching using an alkali chemical, such as tetramethyl ammonium hydroxide (TMAH) or potassium hydroxide (KOH). Then, the remaining resist is removed and the intermediate insulating layer 1b is removed by gas or liquid such as hydrofluoric acid.

At that time, as can be seen from the shape of the intermediate insulating layer 1b shown in FIG. 3, the intermediate insulating layer 1b is not formed below a narrow portion of the active layer 1c and the narrow portion floats from the supporting layer 1a. The intermediate insulating layer 1b remains below a wide portion of the active layer 1c and the wide portion is fixed to the supporting layer 1a. This processing makes it possible to form the mechanical components of the combined sensor S1, such as the inertial mass bodies 11 and 23, the suspension portion 15, and the support beam structures 12 and 24, which will be described below, in the active layer 1c.

Figure 4:
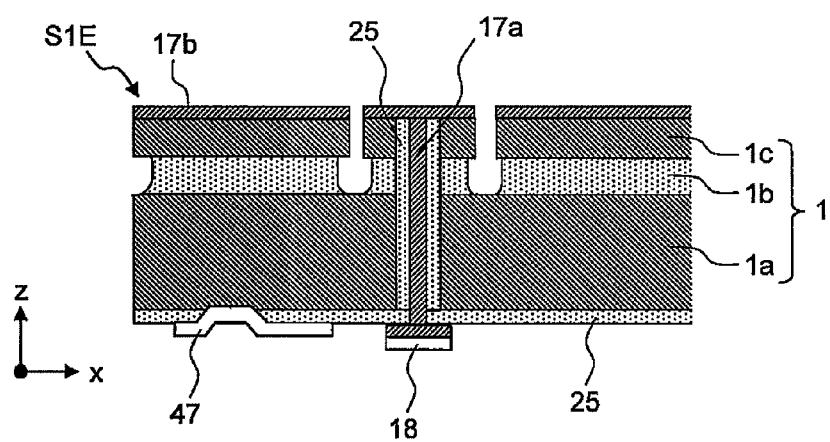
FIG. 4 is a cross-sectional view taken along the line B-B' of FIG. 2.

FIG. 4 is a cross-sectional view taken along the line B-B' of FIG. 2. The through electrode 17 is formed in the suspension portion 15. The through electrode 17 passes through the suspension portion 15 and is connected to the pad 18 formed on the supporting layer 1a. The pad 18 is connected to the IC 50 by the conductive wire 152. A pad 47 is electrically connected to the supporting layer 1a and potential can be applied to the supporting layer 1a through the pad 47.

The through electrode 17 is configured such that it can supply an electric signal from the supporting layer 1a through the pad 18 to apply potential or it can be fixed to a predetermined potential. The through electrode 17 can be formed by the following process.

First, a through hole is formed in the supporting layer 1a, the intermediate insulating layer 1b, and the active layer 1c, and the supporting layer 1a, the intermediate insulating layer 1b, and the active layer 1c are thermally oxidized to form an oxide film 25 around the through hole. Then, polysilicon 17a is filled in the through hole by chemical vapor deposition (CVD). The polysilicon 17a which is deposited on the oxide film 25 during the filling operation and the oxide film 25 which is formed on the surface of the active layer 1c during thermal oxidation are removed by chemical mechanical polishing (CMP) or a plasma etching method such that the surface of the active layer 1c is exposed. Then, polysilicon 17b is deposited by CVD. The through electrode 17 can be formed by the above-mentioned process.

When the polysilicon 17a and the polysilicon 17b are deposited, they may be deposited by two deposition operations. In this case, after the first deposition operation, conductive impurities are implanted into the polysilicon 17a and the polysilicon 17b by thermal diffusion. In this way, it is possible to reduce the electrical resistance of the polysilicon 17a and the polysilicon 17b.

The use of the through electrode 17 makes it possible to input and output electrical signals between the supporting layer 1a and each component formed in the active layer 1c. Therefore, even when the cap 100 is provided on the active layer 1c by anode bonding using glass or other adhesives, it is possible to easily input and output signals between the combined sensor S1 and the outside.

The structure of the combined sensor S1 has been described above. Next, the operation principle of the acceleration detecting unit S1EG will be described.

Figure 5:
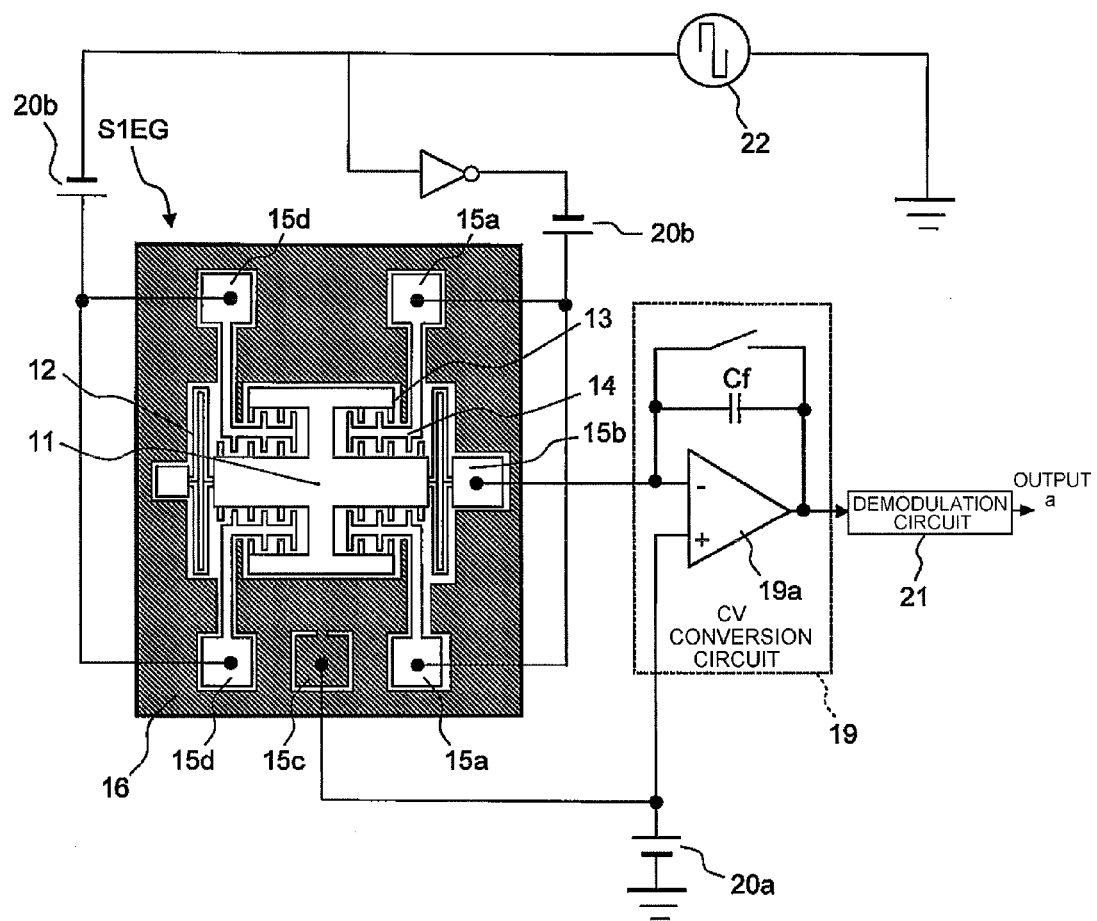
FIG. 5 is a diagram illustrating the connection relationship between an acceleration detecting unit S1EG and peripheral circuits.

FIG. 5 is a diagram illustrating the connection relationship between the acceleration detecting unit S1EG and peripheral circuits. When acceleration is applied to the acceleration detecting unit S1EG, the inertial mass body 11 is displaced by the law of inertia. In this case, the amount of displacement can be calculated by a change in the capacitance between the movable electrode 13 and the fixed electrode 14.

Specifically, when the capacitance between pads 15a and 15d which are connected to the fixed electrode 14 through the through electrode 17 and a pad 15b which is connected to the movable electrode 13 is changed, a capacitance voltage (CV) conversion circuit 19 of the IC 50 converts the change in the capacitance into a voltage and converts a voltage variation into the amount of displacement of the inertial mass body 11. A capacitance difference between the movable electrode 13 and the fixed electrode 14 can be measured by carrier waves which are generated and demodulated by a carrier wave application circuit 22 and a demodulation circuit 21.

In general, the carrier waves use a frequency band of several hundreds of kilohertz which the inertial mass body 11 cannot follow. The high-frequency carrier wave (application circuit) 22 is used for the following reasons (a) and (b). (a) In general, the cutoff frequency of a vibration system including the inertial mass body 11 and the support beam structure 12 is equal to or less than 1 kHz and the vibration system does not follow the carrier wave 22 with a high frequency. Therefore, an operation error is less likely to occur. (b) When the high-frequency carrier wave 22 is used, the AC electric resistance, that is, the impedance of the capacitor formed by the movable electrode 13 and the fixed electrode 14 is reduced and the sensitivity of the sensor is improved.

However, when the frequency of the carrier wave 22 is too high (for example, 1 MHz or more), the carrier wave is restricted by the pass band of an OP-AMP 19a, which will be described below, and the sensitivity of the sensor is reduced.

The CV conversion circuit 19 includes the OP-AMP 19a and a reference capacitor Cf. The difference between the potential 20a which is input to a positive terminal of the OP-AMP 19a and a signal which is input from the pad 15b and is proportional to the displacement of the inertial mass body 11 is amplified to obtain an output Vo. The output Vo from the CV conversion circuit 19 satisfies the following Expression 1:

[Expression 1]

$$Vo = (\Delta C/Cf) \times Vc + Vb \quad (1)$$

(where
$\Delta C$: a capacitance variation between the movable electrode 13 and the fixed electrode 14
Vc: the amplitude of the carrier wave 22
Vb: the potential 20a of the positive terminal of the OP-AMP 19a).

The reference potential 20a which is input to the positive terminal of the OP-AMP 19a forming the CV conversion circuit 19 is also used as the reference potential of the carrier wave 22. That is, the carrier wave 22 has the reference potential 20a as a DC voltage and is a superimposed signal of AC signals with a frequency of several hundreds of kilohertz. The DC components of the carrier wave 22 cancel each other during differential detection. Therefore, in principle, even when there is a difference between the reference potential 20a of the OP-AMP 19a and the reference potential of the carrier wave 22, the sensor output Vo is not affected by the difference between the reference potentials.

However, when a variation in capacitance occurs in the fixed electrode 14 connected to the pad 15a and the fixed electrode 14 connected to the pad 15d due to a processing error during manufacture, the inertial mass body 11 is displaced by the difference in the reference potential 20a. As a result, an offset occurs.

Even when there is no processing error, electrostatic forces which cancel each other in the displacement direction are generated in the inertial mass body 11 due to the difference between the reference voltage applied to the inertial mass body 11 and the potential 20a applied to the positive terminal of the OP-AMP 19a. Therefore, an electrostatic spring effect is generated and a natural angular frequency less than a design value is obtained. When the natural angular frequency is low, displacement x with respect to the application of unit acceleration increases and sensitivity equal to or greater than a design value is obtained. The relationship between the natural angular frequency ω of the vibration system including the inertial mass body 11 and the support beam structure 12 and the displacement x when acceleration is applied is represented by the following Expression 2:

[Expression 2]

$$x = a/\omega^2 \quad (2)$$

(where
x: displacement when acceleration a is applied
$\omega$: $(k/m)^{1/2}$
m: the mass of the inertial mass body 11
k: a spring constant of the support beam structure).

Therefore, it is preferable that the reference potential 20b of the carrier wave 22 be equal to the reference potential 20a of the CV conversion circuit 19. When the power supply potential input to the sensor is Vref, it is preferable that the reference potentials 20a and 20b be Vref/2, that is, half the power supply potential.

As can be seen from the above-mentioned Expression 1, when the reference potential Vb (20a) of the CV conversion circuit 19 is Vref/2, it is possible to obtain positive and negative sensor outputs in proportion to $\Delta C$. In the first embodiment, the circuit which outputs the analog voltage is given as an example. However, a circuit which performs analog-digital conversion (AD conversion) and outputs a digital signal may be used. In this case, it is possible to obtain the same effect as described above.

As can be seen from the above-mentioned Expression 1, as the AC amplitude Vc of the carrier wave 22 increases, the output Vo per unit $\Delta C$ increases. Therefore, when the power supply voltage Vref of the sensor is applied, the reference potential 20a of the carrier wave is set to Vref/2, which makes it possible to obtain the maximum carrier wave amplitude. That is, since a large carrier wave amplitude is ensured, it is possible to obtain the same output even when $\Delta C$ is relatively small. As a result, it is possible to reduce the size of the acceleration detecting unit S1EG.

The operation principle of the acceleration detecting unit S1EG has been described above. Next, the potential of the dummy pattern 16 in the acceleration detecting unit S1EG and the influence thereof will be described.

The dummy pattern 16 is formed in the active layer 1c so as to surround the periphery of the inertial mass body 11, the support beam structure 12, the movable electrode 13, the fixed electrode 14, and the suspension portion 15. The principal purpose of the dummy pattern 16 is to reduce the processing time when deep reactive ion etching (DRIE) is performed for the active layer 1c, manage the aspect ratio as uniformly as possible, and suppress a micro-loading effect. Therefore, it is possible to suppress the occurrence of a notch by the excessive removal of the bottom due to over etching or the occurrence of conductive dust due to black silicon.

However, when there is a potential difference between the movable portion, such as the inertial mass body 11, and the dummy pattern 16 which is provided around the movable portion with a predetermined gap therebetween, the electrostatic spring effect occurs and an offset variation occurs due to the unbalance of electrostatic attractive force caused by a processing error. In addition, the dummy pattern 16 is electrically independent from other portions and the potential of the dummy pattern 16 is inconstant. Therefore, the inflow of charge occurs due to, for example, electromagnetic waves from the outside or friction. As a result, charge-up occurs and the offset or sensitivity of the sensor output varies over time.

Therefore, it is necessary to fix the potential of the dummy pattern 16 to a predetermined value. It is preferable to apply the same potential as the reference potential 20a applied to the inertial mass body 11 to the dummy pattern 16 in order to prevent the electrostatic spring effect, and sticking, an offset, and a sensitivity variation due to electrostatic force. In addition, some effect can be obtained when the gap between the dummy pattern 16 and the inertial mass body 11 or the like adjacent to the dummy pattern 16 increases to some extent and potential close to the reference potential 20a is applied. However, in this case, the IC 50 needs to supply a plurality of potentials and the size of the IC 50 increases, which is not preferable.

In the first embodiment, a pad 15c which is formed in the supporting layer 1a through the through electrode 17 is connected to the IC 50 by the conductive wire 152 to apply potential to the dummy pattern 16.

The potential of the dummy pattern 16 in the acceleration detecting unit S1EG and the influence thereof have been described above. Next, the operation principle of the angular velocity detecting unit S1EY will be described.

Figure 6:
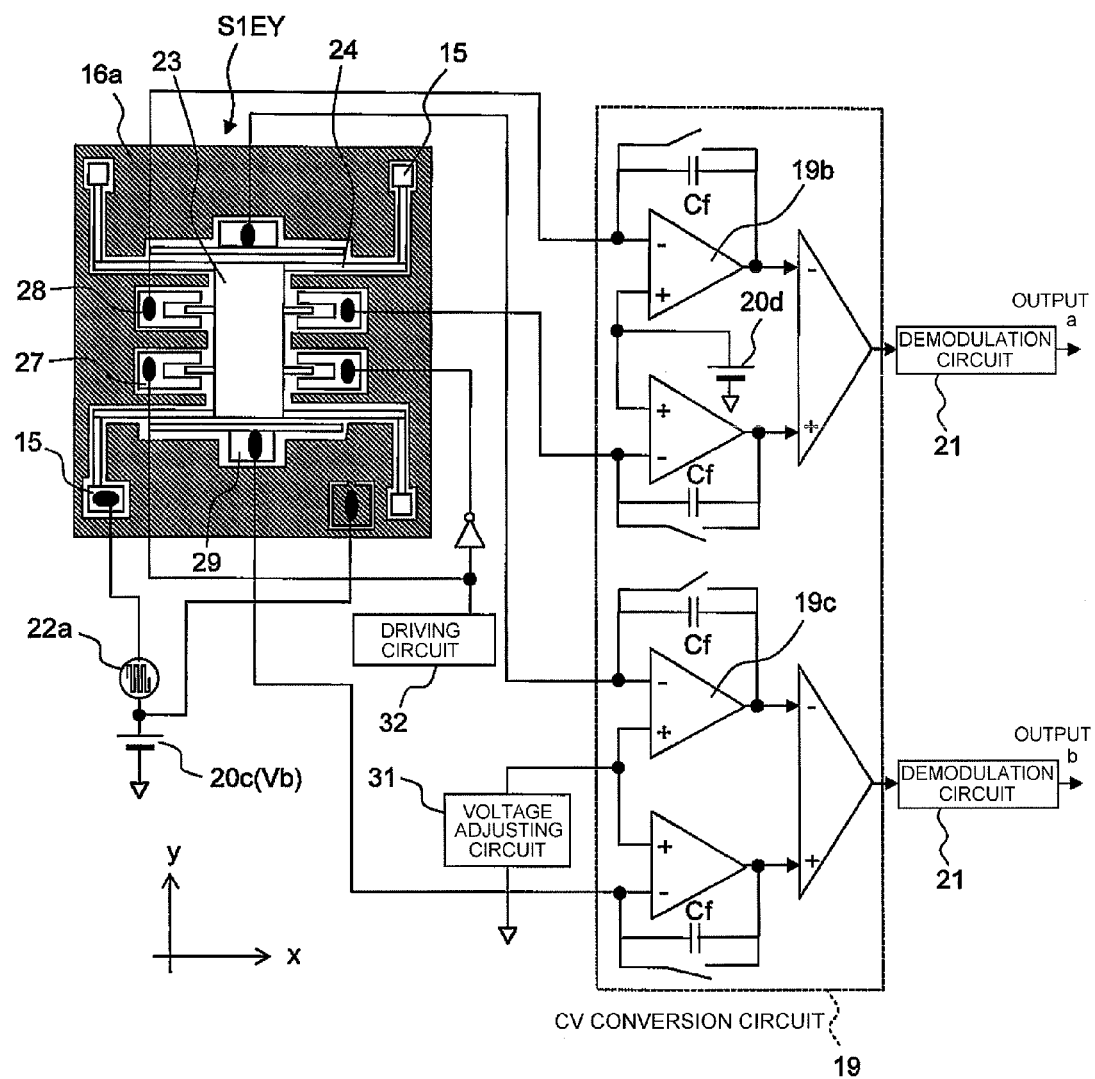
FIG. 6 is a diagram illustrating the connection relationship between an angular velocity detecting unit S1EY and peripheral circuits.

FIG. 6 is a diagram illustrating the connection relationship between the angular velocity detecting unit S1EY and peripheral circuits. The angular velocity detecting unit S1EY includes a driving electrode 27, a monitoring electrode 28, a detection electrode 29, and the suspension portion 15, in addition to the components described with reference to FIG. 2. The driving electrode 27 vibrates the inertial mass body 23 in the driving direction. The monitoring electrode 28 monitors the displacement of the inertial mass body 23 in the driving direction. The detection electrode 29 detects the amount of displacement of the inertial mass body 23 when the inertial mass body 23 is displaced in the detection direction by the angular velocity applied from the outside.

A driving signal generated by a driving circuit 32 is applied to the driving electrode 27. The driving electrode 27 is a fixed electrode which is provided so as to face the movable electrode of the inertial mass body 23 with a predetermined gap therebetween. The driving electrode 27 vibrates the inertial mass body 23 in the driving direction using the electrostatic force which is generated by the driving signal from the driving circuit 32. In this case, the effective potential difference acting on the driving electrode 27 is the difference between the potential of the driving signal and the reference potential of the inertial mass body 23. The reference potential of the inertial mass body 23 is a DC voltage 20c of a carrier wave (application circuit) 22a, which will be described below.

The carrier wave 22a in a frequency band of several hundreds of kilohertz different from that of the carrier wave 22 for measuring the displacement of the inertial mass body 11 is used in order to prevent the mixture of signals with the acceleration detecting unit S1EG formed in the same active layer 1c.

The DC bias voltage (reference potential) 20c applied to the carrier wave 22a is the DC reference potential of the inertial mass body 23. The electrostatic spring effect is generated by the potential difference between the detection electrode 27, which will be described below, and the inertial mass body 23 to adjust the natural angular frequency in the detection direction. Therefore, it is preferable to minimize the potential 20c in order to ensure a wide frequency adjustment range. In the first embodiment, the potential 20c is set to about 1 V.

The Coriolis force Fc which is generated in the detection direction by the application of an angular velocity Ω is defined by the following Expression 3 and the displacement y in the detection direction which is generated by the Coriolis force Fc is represented by the following Expression 4. Therefore, when the sensitivity S of the angular velocity sensor is defined as the ratio of the displacement y in the detection direction to the input angular velocity Ω and Expression 3 is substituted into Expression 4, the sensitivity S (Expression 5) of the angular velocity sensor is obtained.

[Expression 3]
$$F_c = -2m\Omega v \quad (3)$$

(where
m: the mass of the inertial mass body 23
Ω: the applied angular velocity
v: the velocity of the inertial mass body 23 in the driving direction)

[Expression 4]
$$y = \frac{F_c}{k_y} \frac{1}{\left\{\left[1 - \left(\frac{\omega_d}{\omega_y}\right)^2\right]^2 + \left[\frac{1}{Q_y}\frac{\omega_d}{\omega_y}\right]^2\right\}^{1/2}} \quad (4)$$

(where
ky: a spring constant of the support beam structure 24 in the detection direction
ωd: the angular frequency of the driving signal generated by the driving circuit 32
ωy: the natural angular frequency of a detection vibration system including the inertial mass body 23 and the support beam structure 24
Qy: a mechanical quality factor of the detection vibration system)

[Expression 5]
$$S = \left|\frac{y}{\Omega}\right| = \frac{2mv}{k_y} \frac{1}{\left\{\left[1 - \left(\frac{\omega_d}{\omega_y}\right)^2\right]^2 + \left[\frac{1}{Q_y}\frac{\omega_d}{\omega_y}\right]^2\right\}^{1/2}} \quad (5)$$

As can be seen from the above-mentioned Expression 5, when the natural angular frequency ωy of the detection vibration system is equal to the driving angular frequency ωd, the maximum sensitivity S is obtained. The maximum sensitivity S means that the detected amplitude y per unit applied angular velocity is the maximum. Therefore, the maximum sensitivity S means that the input to the CV conversion circuit 19 and the control IC 50 is the maximum. That is, since the displacement y, which is a signal, increases as viewed from the sensor S1, the S/N ratio is improved.

However, in general, the natural angular frequency ωy of the detection vibration system is not necessarily equal to the design value, but deviates therefrom due to a processing error when the inertial mass body 23 and the support beam structure 24 are processed. Therefore, as a known technique, there is a method which applies a DC voltage between the inertial mass body 23 and the fixed electrode which faces the inertial mass body 23 in the detection direction with a predetermined gap therebetween to generate the electrostatic spring effect, thereby adjusting the natural angular frequency of the detection vibration system. In this way, it is possible to improve the sensitivity S of the sensor.

In the first embodiment, the fixed electrode for generating the electrostatic spring effect is not separately provided, but the fixed electrode of the detection electrode 29 is used to generate the electrostatic spring effect. A voltage adjusting circuit 31 is used to apply a DC voltage Vt for adjusting the natural angular frequency to the fixed electrode of the detection electrode 29. A potential difference Vt−Vb (potential 20c) is applied between the inertial mass body 23 and the fixed electrode of the detection electrode 29.

The adjustment range Δfy of a natural frequency fy by the electrostatic spring effect is a function of the potential difference Vt−Vb, as shown in the following Expression 6. It is necessary to apply the maximum potential difference (Vt−Vb) in order to absorb a variation in the natural frequency in a wide range and improve manufacturing yield. The upper limit of the potential which can be supplied by the voltage adjusting circuit 31 is the power supply voltage Vref. Therefore, it is necessary to minimize the reference potential 20c of the carrier wave 22a in order to apply a large potential difference.

[Expression 6] (6)

$$\Delta f_y = f_y - \frac{1}{2\pi}\sqrt{\frac{k_y - \Delta k}{m}}, \Delta k \infty \frac{\Delta V^2}{u^3}$$

(where $\Delta f_y$: the adjustment range of the natural frequency $\Delta k$: the adjustment range of the spring constant of the support beam structure 24 in the detection direction $\Delta V = Vt - Vb$ u: a gap between the inertial mass body 23 and the detection electrode 26)

The reference potential 20c and AC amplitude of the carrier wave 22a are correlated with the size of the detection electrode and other complicated design factors and are not uniformly determined. Therefore, the reference potential 20a=Vref/2 is the optimal condition in the acceleration detecting unit S1EG, but the reference potential 20c needs to be set to a different value for each design in the angular velocity detecting unit S1EY. The reference potential 20c is limited by the AC amplitude of the carrier wave 22a. In the first embodiment, as described above, the reference potential 20c is set to about 1 V and the AC amplitude of the carrier wave is set to 1 Vpp.

The operation principle of the angular velocity detecting unit S1EY has been described above. Next, the potential of the dummy pattern 16a in the angular velocity detecting unit S1EY and the influence thereof will be described.

It is preferable that the same potential as the reference potential 20c be applied to the dummy pattern 16a of the angular velocity detecting unit S1EY, similar to the mechanism for setting the potential 20a of the dummy pattern 16 of the acceleration detecting unit S1EG. In this case, the potential 20a applied to the dummy pattern 16 of the acceleration detecting unit S1EG is not necessarily equal to the potential 20c applied to the dummy pattern 16a of the angular velocity detecting unit S1EY.

In the sensor element S1E of the combined sensor S1 according to the first embodiment, as shown in FIG. 2, a complex of the acceleration detecting unit S1EG and the angular velocity detecting unit S1EY is arranged in one active layer 1c. Therefore, it is necessary to electrically separate the dummy patterns 16 and 16a in order to apply different potentials to the dummy patterns 16 and 16a.

It is possible to simply separate the active layer 1c between the acceleration detecting unit S1EG and the angular velocity detecting unit S1EY in the longitudinal direction. However, since a plurality of sensor elements S1E are formed on one SOI substrate 1, there is a concern that, when the combined sensors S1 are separated by dicing, water or dust will enter grooves during dicing and electrical leakage will occur, which is not preferable.

Therefore, in the first embodiment, the dummy pattern 16 of the acceleration detecting unit S1EG extends in a shape which surrounds the angular velocity detecting unit S1EY and the gap 30 is formed to electrically separate the dummy patterns 16 and 16a. Since the cap 100 is hermetically sealed on the dummy pattern 16, it is possible to prevent the infiltration of water or dust during dicing.

The capacitance voltage (CV) conversion circuit 19, the circuit for applying the reference potentials 20a to 20d, the demodulation circuit 21, the carrier wave application circuits 22 and 22a, the voltage adjusting circuit 31, and the driving circuit 32 which have been described with reference to FIGS. 5 and 6 can be formed in the IC 50.

First Embodiment

Summary

As described above, in the combined sensor S1 according to the first embodiment, a plurality of movable portions which detect an inertia are formed in the same layer and the dummy patterns arranged in the periphery of each movable portion are electrically separated from each other. Therefore, it is possible to apply the same potential to each movable portion and the peripheral dummy patterns and thus suppress a reduction in the S/N ratio, the offset, and a variation in sensitivity due to the potential difference between the peripheral dummy pattern and the movable portion.

In addition, the combined sensor S1 according to the first embodiment can adjust the reference potentials 20a and 20c to widen the adjustment range of a variation in the natural angular frequency due to a processing error during manufacturing. Therefore, it is possible to improve yield and reduce manufacturing costs.

Second Embodiment

In the combined sensor S1 according to the first embodiment, the acceleration detecting unit S1EG and the angular velocity detecting unit S1EY are formed in the active layer 1c of the SOI substrate 1 and are fixed and suspended to the supporting layer 1a through the intermediate insulating layer 1b. Therefore, the inertial mass bodies 11 and 23 and the supporting layer 1a are electrically separated from each other and are mechanically arranged so as to face each other, with a gap corresponding to the thickness of the intermediate insulating layer 1b therebetween. That is, similarly to the dummy patterns 16 and 16a, it is necessary to fix potential in the supporting layer 1a.

Similarly to the structure in which the dummy pattern 16 of the acceleration detecting unit S1EG is electrically separated from the dummy pattern 16a of the angular velocity detecting unit S1EY and different potentials are applied to the dummy patterns 16 and 16a, a portion of the supporting layer 1a which is disposed below the acceleration detecting unit S1EG may be separated from another portion of the supporting layer 1a which is disposed below the angular velocity detecting unit S1EY. The potential of the dummy pattern 16 is applied to the portion of the supporting layer 1a which is disposed below the acceleration detecting unit S1EG and the potential of the dummy pattern 16a is applied to the portion of the supporting layer 1a which is disposed below the angular velocity detecting unit S1EY.

The pad 47 which is made of a conductive material, such as aluminum, can be connected to the IC 50 by the conductive wire 152 to apply potential to the supporting layer 1a.

Third Embodiment

It is considered that the division of the supporting layer 1a with a thickness of several hundreds of micrometers into two parts as in the second embodiment is not preferable in terms of strength and difficulty in processing. Therefore, in a third embodiment of the invention, the potential of the supporting layer 1a is set to be equal to the potential of the dummy pattern 16 of the acceleration detecting unit S1EG, without dividing the supporting layer 1a into two parts, unlike the second embodiment. Hereinafter, the reason will be described.

In a detection vibration system forming the acceleration detecting unit S1EG, the natural angular frequency ω represented by the above-mentioned Expression 2 is reduced to obtain high sensitivity S. In particular, in an acceleration sensor which is mainly used to measure the behavior of a low-frequency wave including a DC component, such as inclination or gravity, as in the traveling control of a vehicle and the posture detection of a robot, it is preferable that the over-damping design in which the natural angular frequency ω is reduced to increase the sensitivity S be used to reduce a mechanical cutoff frequency so as not to react to high-frequency vibration disturbance.

On the other hand, in the angular velocity detecting unit S1EY, as shown in the above-mentioned Expression 5, in order to obtain high sensitivity, the driving angular frequency ωd is equal to the natural angular frequency ωy of the detection vibration system. However, in the natural environment, low-frequency vibration disturbance, such as 1/f noise or 1/f^2 noise, occurs mainly. Therefore, it is necessary to maximize the natural frequency ωy of the detection vibration system in order to obtain an angular velocity sensor with high vibration resistance.

As can be seen from the above-mentioned examination result, it is preferable that the natural angular frequency of the detection vibration system of the acceleration detecting unit S1EG be low and the natural angular frequency of the angular velocity detecting unit S1EY be high in order to improve the sensitivity and reliability of the combined sensor S1.

As can be seen from the above-mentioned Expression 6, when a potential difference ΔV occurs between the supporting layer 1a, and the inertial mass bodies 11 and 23 and the peripheral dummy patterns 16 and 16a, a variation in Δf increases as the spring constant (ky) is reduced. Therefore, the potential of the supporting layer 1a is set in accordance with the reference potential 20a of the dummy pattern 16 of the acceleration detecting unit S1EG which has a relatively small spring constant and is likely to be affected by ΔV.

The inertial mass body 11 of the acceleration detecting unit S1EG and the inertial mass body 23 of the angular velocity detecting unit S1EY each have a weight of about 30 μg to 100 μg and the weight ratio of the inertial mass bodies 11 and 23 is a maximum of 1:5. The inertial mass bodies 11 and 23 have natural angular frequencies of about 6000 rad/s and 60000 rad/s and the ratio of the natural angular frequencies is designed to be about 1:10. Therefore, the spring constant of the detection vibration system of the angular velocity detecting unit S1EY is about equal to or more than twenty times the spring constant of the detection vibration system of the acceleration detecting unit S1EG. That is, in the angular velocity detecting unit S1EY, even when there is a little potential difference ΔV from the peripheral dummy pattern 16a, the supporting layer 1a, and the cap 100, the influence of the potential difference is limited.

As described above, it is preferable that there be no DC potential difference between the inertial mass bodies 11 and 23 and the dummy patterns 16 and 16a, which are 'peripheral conductors' of the inertial mass bodies 11 and 23 and between the inertial mass bodies 11 and 23, and the supporting layer 1a and the cap 100. However, when the potential needs to be equal to any one of the potentials of the inertial mass bodies 11 and 23, it may be equal to the reference potential 20a of the inertial mass body 11 which is largely displaced by the electrostatic force between the inertial mass body 11 and the 'peripheral conductor'. In addition, of the acceleration sensor and the angular velocity sensor, the inertial mass body in the acceleration sensor is more largely displaced by the electrostatic force.

Specifically, in order to make the potentials of the dummy patterns 16 and 16a equal to the DC potentials 20a and 20c of the inertial mass bodies 11 and 23, the dummy patterns 16 and 16a may be separated from each other and a potential generation circuit and a corresponding pad for outputting the potentials 20a and 20c to the IC 50 may be provided.

Third Embodiment

Summary

As described above, in the combined sensor S1 according to the third embodiment, the supporting layer 1a is not separated and the reference potential (20a or 20c) corresponding to one of the inertial mass bodies 11 and 23 which is more largely displaced by electrostatic force is applied. Therefore, it is possible to minimize the influence of the electrostatic force generated by the potential difference while solving the problems related to the strength of the combined sensor S1 or difficulty in processing.

Fourth Embodiment

In the first to third embodiments, the glass cap 100 including sodium and the SOI substrate 1 are bonded to each other by the anode bonding technique. However, a conductive substrate, such as a silicon substrate, may be bonded to the SOI substrate 1 by, for example, surface activated bonding, glass frit bonding, or a bonding technique using a metal adhesive. In this case, the cap 100 is arranged adjacent to, for example, the inertial mass body 11, the support beam structure 12, and the movable electrode 13 with a predetermined gap therebetween. As a result, for example, an offset, a sensitivity variation, and sticking are likely to occur due to the potential difference therebetween.

In the fourth embodiment according to the invention, similarly to the potential of the dummy pattern 16, the potential of the cap 100 is set to be equal to the reference potential 20a of the inertial mass body 11 to prevent the above-mentioned problems. The reason why the potential of the cap 100 is set to be equal to the reference potential 20a is the same as that in the third embodiment.

A conductive adhesive is applied onto a contact portion between the dummy pattern 16 and the cap 100 to apply the same potential as that of the dummy pattern 16 to the cap 100. When a non-conductive adhesive, such as glass frit, is used for the contact portion between the dummy pattern 16 and the cap 100, the sensor element S1E and the IC 50 are bonded to each other by a conductive adhesive such as silver paste. Therefore, it is possible to apply potential from a potential application pad (not shown) which is formed on the IC 50.

A predetermined potential is applied to the dummy pattern 16, the cap 100, and the supporting layer 1a such that the dummy pattern 16, the cap 100, and the supporting layer 1a function as a shield for shielding electromagnetic waves from the outside. Therefore, the reliability of the sensor S1 can be expected to be further improved.

Fourth Embodiment

Summary

As described above, in the combined sensor S1 according to the fourth embodiment, the reference potential (20a or 20c) corresponding to one of the inertial mass bodies 11 and 23 which is more largely displaced by electrostatic force is applied to the cap 100. Therefore, it is possible to minimize the influence of the electrostatic force generated by the potential difference.

According to the combined sensor S1 of the fourth embodiment, since the potential of all of the main components is set to the reference potential (20a or 20c), it is possible to reduce the number of wires connected to the potential generation circuit and reduce the size of the circuit. In addition, it is possible to reduce failure due to the disconnection of the wires.

Fifth Embodiment

In the first to fourth embodiments, the space between the cap 100 and the acceleration detecting unit S1EG may be separated from the space between the cap 100 and the angular velocity detecting unit S1EY, the former space may be sealed at atmospheric pressure, and the latter space may be vacuum-sealed. In addition, the caps 100 may be provided in each space so as to be electrically separated from each other and the reference potentials (20a or 20c) may be individually applied. In this case, it is possible to reduce the influence of the electrostatic force generated by a potential difference.

Sixth Embodiment

The dummy patterns 16 and 16a are not necessarily separated from each other and the same potential may be applied to the dummy patterns 16 and 16a, depending on accuracy required for the combined sensor S1 and the purpose thereof. In this case, when there is a potential difference between the inertial mass bodies 11 and 23 and the dummy patterns 16 and 16a, the reference potential applied to the inertial mass body which is more largely displaced by electrostatic force may be applied to the dummy patterns 16 and 16a.

The invention conceived by the inventors has been described in detail with reference to the embodiments. However, the invention is not limited to the above-described embodiments, but various modifications and changes of the invention can be made without departing from the scope and spirit of the invention. For example, the combined sensor S1 according to the invention can be used as an inertia measurement and control sensor which is used in a vehicle traveling control device or a robot posture control device. In particular, the combined sensor S1 according to the invention can be used as an inertial sensor which is manufactured by a MEMS technique and detects a plurality of kinds of inertia or has a plurality of detection axes using a change in capacitance.

REFERENCE SIGNS LIST

S1: COMBINED SENSOR
S1E: COMBINED SENSOR ELEMENT
S1EG: ACCELERATION DETECTING UNIT
S1EY: ANGULAR VELOCITY DETECTING UNIT
1: SOI SUBSTRATE
1a: SUPPORTING LAYER
1b: INTERMEDIATE INSULATING LAYER
1c: ACTIVE LAYER
11: INERTIAL MASS BODY OF ACCELERATION DETECTING UNIT
12: SUPPORT BEAM STRUCTURE OF ACCELERATION DETECTING UNIT
13: MOVABLE ELECTRODE
14: FIXED ELECTRODE
15: FIXED PORTION (SUSPENSION PORTION)
16: DUMMY PATTERN OF ACCELERATION DETECTING UNIT
16a: DUMMY PATTERN OF ANGULAR VELOCITY DETECTING UNIT
17: THROUGH ELECTRODE
17a, 17b: POLYSILICON
18: PAD
19: CAPACITANCE VOLTAGE (CV) CONVERSION CIRCUIT
19a: OP-AMP
20a: REFERENCE POTENTIAL
20b: REFERENCE POTENTIAL
20c: REFERENCE POTENTIAL
20d: REFERENCE POTENTIAL
21: DEMODULATION CIRCUIT
22: CARRIER WAVE APPLICATION CIRCUIT
22a: CARRIER WAVE APPLICATION CIRCUIT
23: INERTIAL MASS BODY OF ANGULAR VELOCITY DETECTING UNIT
24: SUPPORT BEAM STRUCTURE OF ANGULAR VELOCITY DETECTING UNIT
25: OXIDE FILM
27: DRIVING ELECTRODE
28: MONITORING ELECTRODE
29: DETECTION ELECTRODE
30: GAP
31: VOLTAGE ADJUSTING CIRCUIT
32: DRIVING CIRCUIT
47: PAD
100: CAP
152: CONDUCTIVE WIRE
153: LID
154: EXTERNAL INPUT/OUTPUT TERMINAL

The invention claimed is:

1. A combined sensor comprising:
a first movable portion and a second movable portion that are displaced depending on a change in physical quantity;
a fixed portion that forms capacitance between the first movable portion and the second movable portion;
a detecting unit that detects displacement of the first movable portion and displacement of the second movable portion using a change in the capacitance;
a first dummy portion that is provided around the first movable portion;
a second dummy portion that is provided around the second movable portion; and
a potential generation circuit that applies a potential to the first movable portion, the second movable portion, the first dummy portion, and the second dummy portion,
wherein the first movable portion, the second movable portion, the fixed portion, the first dummy portion, and the second dummy portion are formed in the same conductive layer of a laminated substrate,
the first dummy portion and the second dummy portion are electrically separated from each other, and
the potential generation circuit applies a first potential to the first movable portion and the first dummy portion and applies a second potential to the second movable portion and the second dummy portion.

2. The combined sensor according to claim 1,
wherein the laminated substrate is formed by laminating a supporting layer, an intermediate insulating layer, and an active layer, and
the first movable portion, the second movable portion, the fixed portion, the first dummy portion, and the second dummy portion are formed in the active layer.

3. The combined sensor according to claim 2, further comprising:
a gap portion that is provided between the first dummy portion and the second dummy portion in the active layer and electrically separates the first dummy portion and the second dummy portion.

4. The combined sensor according to claim 2,
wherein the supporting layer includes:
a first supporting portion that is provided below the first movable portion; and
a second supporting portion that is provided below the second movable portion,
the first supporting portion and the second supporting portion are electrically separated from each other, and
the potential generation circuit applies the first potential to the first supporting portion and applies the second potential to the second supporting portion.

5. The combined sensor according to claim 2,
wherein the potential generation circuit applies the first potential to the supporting layer when the amount of displacement of the first movable portion by electrostatic force is more than the amount of displacement of the second movable portion by the electrostatic force, and
the potential generation circuit applies the second potential to the supporting layer when the amount of displacement of the second movable portion by the electrostatic force is more than the amount of displacement of the first movable portion by the electrostatic force.

6. The combined sensor according to claim 2,
wherein the supporting layer is connected to the ground.

7. The combined sensor according to claim 1, further comprising:
a lid portion that covers the first movable portion and the second movable portion.

8. The combined sensor according to claim 7,
wherein the lid portion is made of a conductive material, and
the potential generation circuit applies the first potential or the second potential to the lid portion.

9. The combined sensor according to claim 7,
wherein the lid portion is connected to the ground.

10. The combined sensor according to claim 7,
wherein the potential generation circuit applies the first potential to the lid portion when the amount of displacement of the first movable portion by electrostatic force is more than the amount of displacement of the second movable portion by the electrostatic force, and
the potential generation circuit applies the second potential to the lid portion when the amount of displacement of the second movable portion by the electrostatic force is more than the amount of displacement of the first movable portion by the electrostatic force.

11. The combined sensor according to claim 1,
wherein the potential generation circuit applies the first potential to the first dummy portion and the second dummy portion when the amount of displacement of the first movable portion by electrostatic force is more than the amount of displacement of the second movable portion by the electrostatic force, and
the potential generation circuit applies the second potential to the first dummy portion and the second dummy portion when the amount of displacement of the second movable portion by the electrostatic force is more than the amount of displacement of the first movable portion by the electrostatic force.

12. The combined sensor according to claim 1,
wherein the first movable portion is an angular velocity detecting unit including an inertial body that is vibrated in a predetermined driving direction by electrostatic force and is displaced in a direction orthogonal to the driving direction by Coriolis force when an angular velocity is applied, and
the second movable portion is an acceleration detecting unit including an inertial body that is displaced when an angular velocity is applied.

13. The combined sensor according to claim 12, further comprising:
a lid portion that covers the first movable portion and the second movable portion,
wherein a space between the lid portion and the angular velocity detecting unit is vacuum-sealed, and
a space between the lid portion and the acceleration detecting unit is sealed at atmospheric pressure.

* * * * *